United States Patent [19]

Sakakibara et al.

[11] Patent Number: 4,860,170

[45] Date of Patent: Aug. 22, 1989

[54] POINTER ILLUMINATING STRUCTURE IN MEASURING INSTRUMENT

[75] Inventors: Yutaka Sakakibara; Hidetaka Ueda; Kunio Majima, all of Shimada, Japan

[73] Assignee: Yazaki Corporation, Tokyo, Japan

[21] Appl. No.: 161,252

[22] Filed: Feb. 22, 1988

Related U.S. Application Data

[60] Continuation of Ser. No. 879,973, Jun. 30, 1986, abandoned, which is a division of Ser. No. 628,278, Jul. 6, 1984, Pat. No. 4,625,262.

[30] Foreign Application Priority Data

Jul. 8, 1983 [JP] Japan .................... 58-105444
Aug. 19, 1983 [JP] Japan .................... 58-127221
Aug. 19, 1983 [JP] Japan .................... 58-127222

[51] Int. Cl.⁴ ........................................ G01D 11/28
[52] U.S. Cl. ............................. 362/26; 362/31; 362/32; 116/288
[58] Field of Search .............. 362/23, 26, 29, 30, 362/31, 32, 346, 307, 327; 116/DIG. 36, 286, 287, 288

[56] References Cited

U.S. PATENT DOCUMENTS

| | | | |
|---|---|---|---|
| 2,831,453 | 4/1958 | Hardesty | 362/26 |
| 3,129,691 | 4/1964 | Walker | 16/288 |
| 4,218,726 | 8/1980 | Fukasawa et al. | 362/26 |
| 4,252,078 | 2/1981 | Fukasawa et al. | 116/288 |
| 4,300,470 | 11/1981 | Furukawa | 116/288 |
| 4,380,043 | 4/1983 | Takamatsu et al. | 362/26 |
| 4,625,262 | 11/1986 | Sakaleibara et al. | 362/26 |

FOREIGN PATENT DOCUMENTS

| | | | |
|---|---|---|---|
| 3343861 | 6/1985 | Fed. Rep. of Germany | 116/288 |
| 2024426 | 11/1980 | United Kingdom | 116/288 |

Primary Examiner—Ira S. Lazarus
Assistant Examiner—D. M. Cox

[57] ABSTRACT

A pointer illuminating structure in a measuring instrument. A pointer of the measuring instrument is of a generally elongated structure and transparent. At an intermediate portion thereof, a light inducing section is provided to extend substantially perpendicularly to the generally elongated structure to form a T shape. The pointer has a flat upper surface and lower surfaces extending from about both side of the light inducing section. A reflective material is applied to the lower surfaces. Beneath the upper surface and above levels of the lower surface, cavities laterally extend to open sideways. Said cavities are defined by reflective surfaces. In alternative form, said elongated pointer is formed with a truncated conical portion at the light inducing section. Said truncated conical portion has a truncated conical reflective surface. The reflective material is applied to the side surfaces instead of the lower surface thereof.

2 Claims, 11 Drawing Sheets

POINTER ILLUMINATING STRUCTURE IN MEASURING INSTRUMENT

This application is a continuation, of application Serial No. 879,973, filed June 30, 1986, now abandoned, which is a divisional of Serial No. 06/628,078, filed 7/6/84 now U.S. Pat. No. 4,625,262.

BACKGROUND OF THE INVENTION

The present invention relates to a pointer illuminating structure in a measuring instrument.

Heretofore, a pointer illuminating structure has been demanded for improving the visuality of a measuring instrument when used during the night or for some reason concerned with design.

Figures 1, 2:
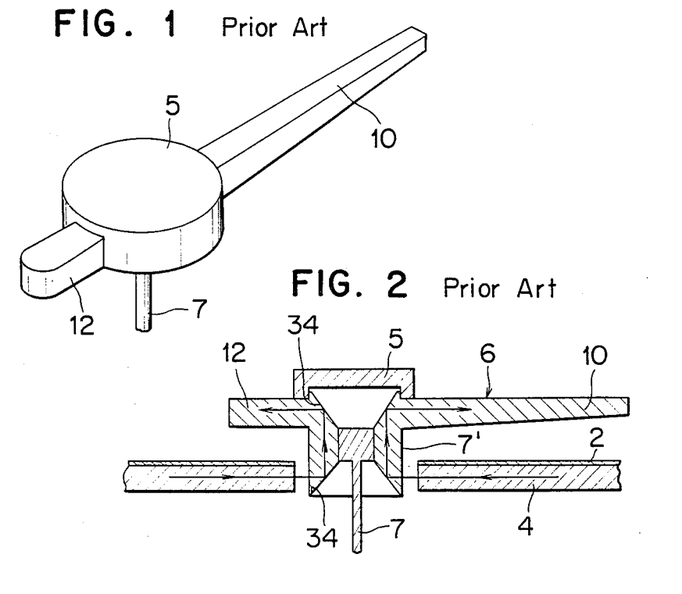
FIG. 1 is a perspective view showing one type of the conventional pointer illuminating structure.
FIG. 2 is a sectional view showing the pointer illuminating structure of FIG. 1.
Figures 3, 4:
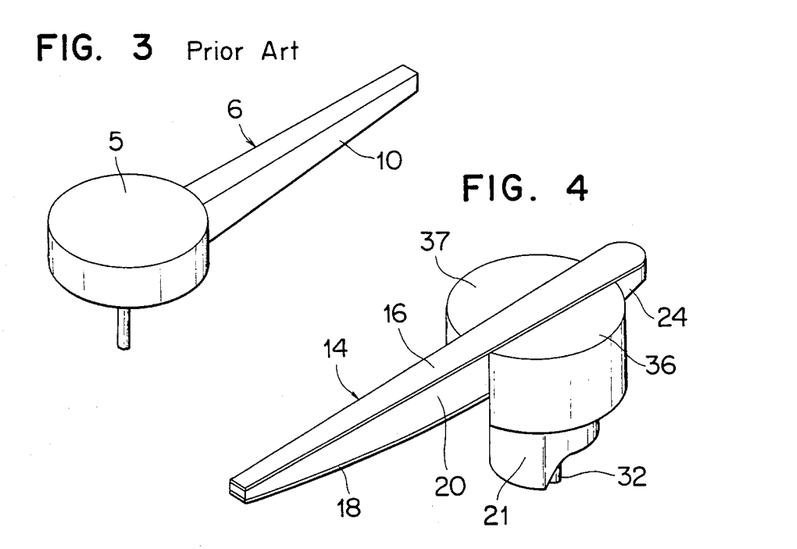
FIG. 3 is a perspective view of another type of the pointer illuminating structure.
FIG. 4 is a perspective view of one embodiment of the pointer illuminating structure in a measuring instrument according to the present invention.

As conventional pointer illuminating structures, there are such devices as shown in FIGS. 1 to 3, of which FIGS. 1 and 3 are perspective views of different conventional pointer illuminating structures and FIG. 2 is a sectional view of the structure of FIG. 1 as mounted to a measuring instrument.

In FIG. 1, the numeral 6 denotes a pointer having a fore end portion 10 and a rear end portion 12, with a pointer cap 5 being fitted over an intermediate portion between the fore end portion 10 and the rear end portion 12 to cover that portion of the pointer 6. The numeral 7 denotes a pointer support shaft.

Operation of the conventional structure of FIG. 1 will now be described with reference to FIG. 2. The numeral 2 denotes a dial plate of measuring instrument (not shown). Light is radiated directly from a light source (not shown) to a photoconductive plate 4 which is attached to the back of the dial plate 2. The radiated light is incident upon the circumference of a central light receiving portion 7 which is opposed to the photoconductive plate 4, then this incident light is reflected as indicated with arrows in FIG. 2 by a conical reflective surface 34 formed in the central light receiving portion and reaches the fore and rear end portions 10 and 12 of the pointer 6 to illuminate those portions.

In the structure of FIG. 3, the pointer 6 has only the fore end portion 10, not having the rear end portion 12, but the operation is the same as above.

In those conventional devices having such constructions and functions, however, since the pointer cap 5 for the prevention of light leak is sure to be fitted over the pointer 6, the luminous portion of the pointer 6 is scissioned by the pointer cap 5, thus making it impossible to illuminate the entirety of the pointer 6. That is, the visuality in nighttime use is low, and also in point of design, there are restrictions.

SUMMARY OF THE INVENTION

It is the object of the present invention to provide an improved pointer illuminating structure capable of overcoming the above-mentioned drawbacks of the conventional devices and improving the visuality in nighttime use by illuminating the entirety of a pointer as an integral body, and having a good design.

In order to achieve the above-mentioned object there is provided a pointer illuminating structure in a measuring instrument in which a pointer itself is illuminated by conducting light to the interior of the pointer, said pointer illuminating device including the pointer and a cap, said pointer comprising an upper transmissive colored portion, a lower reflective colored portion and a transparent portion disposed therebetween, said transparent portion being provided with a central reflecting portion having a plurality of sideways opened, hollow, curved reflective surfaces, and said cap covering, and said cap covering said central reflecting portion sideways and not covering the upper surface of the pointer.

BRIEF DESCRIPTION OF THE DRAWINGS

Other objects, features and advantages of the invention will become apparent as the description proceeds with reference to the drawings in which

FIGS. 28b to 28d are sectional views taken along lines B, C and D of FIG. 28a;

FIG. 29 is an exploded view of FIG. 28a;

FIG. 30 is a longitudinal sectional view of FIG. 28a;

FIG. 31 is a diagramatic plan view of FIG. 28a showing the operation thereof;

FIG. 32 is a sectional view showing a modification of FIG. 30;

FIG. 33 is a perspective view showing another modification of FIG. 29;

FIG. 34a is a perspective view of a still further embodiment of the invention;

FIGS. 34b, 34c and 34d are sectional views taken along lines B, C and D;

FIG. 35 is an exploded perspective view of FIG. 34a;

DETAILED DESCRIPTION OF THE EMBODIMENTS

The present invention will be described concretely hereinunder with reference to the drawings.

In FIG. 4, the numeral 14 denotes an elongated pointer body composed of an upper transmissive colored portion 16, lower reflective colored portions 18, 24 and a transparent portion 20 formed of a transparent resin between those upper and lower colored portions, the coloring being effected by two-color molding coating, or any other suitable method. These component portions are formed by insert molding or press-fit molding integrally with a pointer support shaft 22 which is used for connecting the pointer to the measuring instrument interior (not shown). A more detailed explanation will now be made with reference to FIG. 5. Said transparent portion 20 of the pointer body 14 has a light inducing section 21 at an intermediate portion thereof. Said light inducing section 21 extends substantially perpendicularly to the generally elongated structure to form a T shape. Said transparent portion 20 has a substantially flat upper surface and lower surfaces extending from both sides of said light inducing section 21. The lower reflective colored portion 24, which is formed at the rear end of the pointer, may be differently shaped to keep weight balance of the entirety of the pointer 14. The upper transmissive colored portion 16 is applied to said flat upper surface of the transparent portion 20 and comprises a fore end part 26 for pointing to a scale mark on a dial plate (see 40 in FIG. 6) and a rear end part 28 having a design effect. Said lower reflective colored portions 18 and 24 are applied to said lower surfaces of the transparent portions 20.

Figure 5:
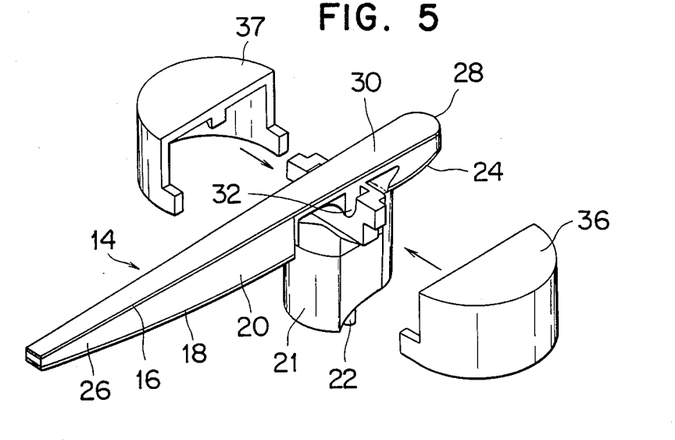
FIG. 5 is an exploded perspective view of the embodiment of FIG. 4.

Further, in order to conduct refracted and reflected light rays of the introduced light to the upper fore end part 26, upper rear end part 28 and central upper surface 30 of the pointer effectively and uniformly, there is provided a central reflecting portion 32 at the central part of the pointer (above the transparent portion 20 overlying the pointer support shaft 22).

A pair of divided pointer caps 36 and 37 are for covering sideways the other portions than the printer portion to be illuminated including the upper surface 30 to intercept light from the central reflecting portion 32. The pointer caps 36 and 37, formed of a suitably colored resin or a light non-transmissive light metal such as an aluminum plate, are attached to both side faces of the pointer 14 by welding, fitting or any other suitable method.

Operation of the device shown in FIG. 4 will now be described with reference to FIG. 6. Light from a light source (not shown) passes as indicated with arrows through a photoconductive plate 42 mounted on the back of a dial plate 40 of the measuring instrument, then is reflected in a vertical direction by a lower conical light introducing portion 44 of the pointer 14 and introduced to the central reflecting portion 32. Of importance in this connection is that the central reflecting portion 32 is formed with reflective surfaces 46 and 48 defining cavities laterally extending beneath said flat upper surface and above levels of said lower surfaces of the transparent portions 20 to open sideways.

The reflective surface 48 reflects light to the upper fore end part 26 of the pointer, while the reflective surface 46 is in a shape gradually approaching a horizontal plane thereby allowing light to transmit upwards therethrough to prevent unevenness in brightness caused by an abrupt change in luminance between the front and the rear above the reflective surface. Further, reflective surface corner portions 50, 52 and 54 are curved to prevent light from being localized to form a shadow.

A rear hollow reflecting portion 56 also functions to diffuse light forward, upward and rearward uniformly.

Such hollow curved reflecting portions are formed, for example, by drawing sideways of the pointer at the time of molding operation.

Figure 7:
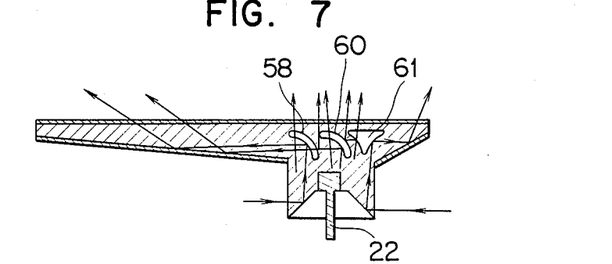
FIG. 7 is a sectional view showing another embodiment of the invention and illustrating the operation thereof.
Figure 8:
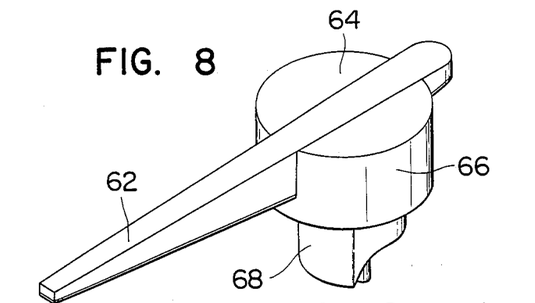
FIG. 8 is a perspective view of a further embodiment of the invention.

FIG. 7 is a sectional view of a pointer illuminating device according to another embodiment of the present invention, which is characteristic in that there are formed three hollow curved reflecting portions - front reflecting portion 58, central reflecting portion 60 and rear reflecting portion 61.

Figure 6:
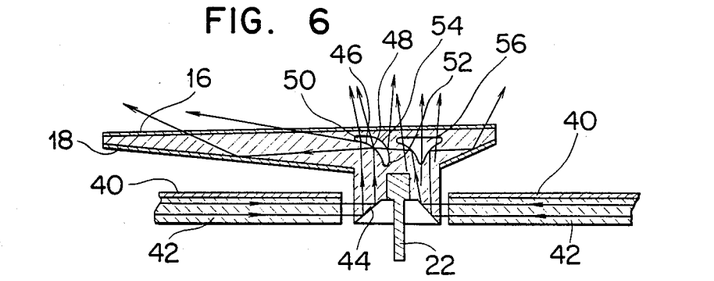
FIG. 6 is a sectional view explaining the operation of the embodiment of FIG. 4.

The function of the reflecting portions 58 and 60 is the same as that in FIG. 6, but in the case of a large pointer, such an increase in the number of reflecting portions permits an efficient conduction of incident light to the front and rear ends of the pointer, affords a sufficient diffusibility upwards and thus permits a uniform illumination of the entirety of the pointer.

Another embodiment of the present invention will be described with reference to FIGS. 8 to 13. As shown in FIG. 3, the entire upper surface of a pointer body 62 is exposed, and a pair of cylindrical split caps with ceiling 64 and 66 are attached to the pointer body 62 sideways by fitting (see FIG. 9). The numeral 94 denotes a transparent, central light receiving portion for conducting light to the pointer body 62.

Figure 10:
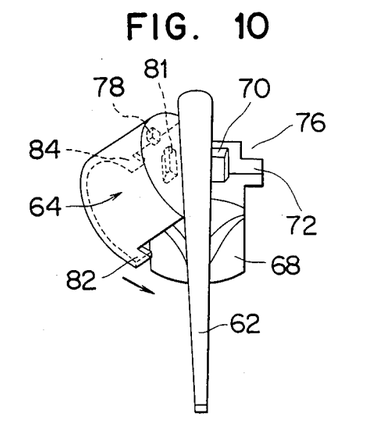
FIG. 10 is a perspective view illustrative of mounting of a cap in the embodiment of FIG. 8.
Figure 11:
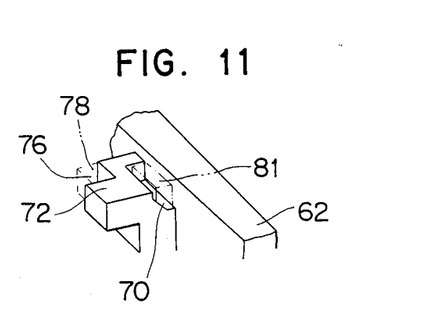
FIG. 11 is a partially enlarged view of FIG. 10.
Figure 12:
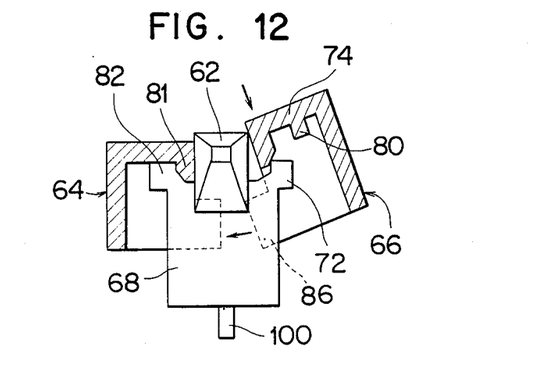
FIG. 12 is a transverse sectional view of FIG. 9.

The following description is now provided about how to mount and remove the caps 64 and 66 with reference to FIGS. 10 to 12.

On each of both upper right and left sides of the central light receiving portion 94 of the pointer 62 is formed an arm portion having a recess 70 and a projection 72. Also on the back of the cap 64 (66) to be engaged with the arm portion are formed a projection 81 (74) for engagement with the recess 70 and a projection 78 (80) for engagement with a notched part 76 of the projection 72 of the arm portion. Therefore, simply by pushing the cap 64 (66) from above, its position is decided, and it will never float ecdentrically back and forth in the longitudinal direction of the pointer body 62.

Further, the cap 64 (66) is provided with a pair of lugs 82 and 84 (86 and 88) in front and rear positions of its lower end. Engagement of these lugs with the bottom of the pointer body 62 ensures fixing of the cap 64 (66) without floating in any directions.

The cap 64 (66) can be removed by first pulling out the lugs 82 and 84 (86 and 88) conversely to the arrow shown in FIG. 10.

In order to make such mounting and removal of the caps easier and more assured, it is preferable that the caps be formed of a highly elastic material such as an opaque resin or a metallic sheet. Being opaque is necessary for the prevention of light leak.

The pointer is illuminated in the following manner. In this connection, reference is made to FIG. 13.

Figure 13:
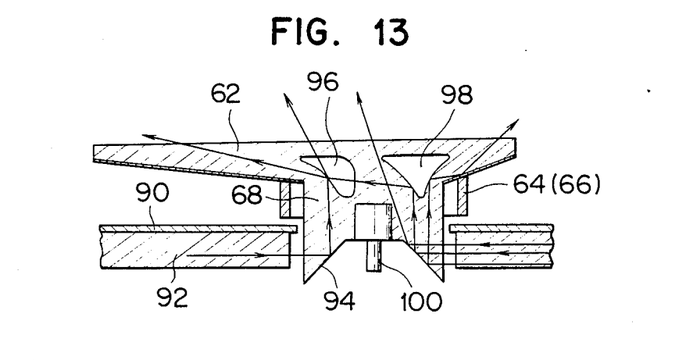
FIG. 13 is a longitudinal sectional view of the FIG. 8 showing the operation thereof.

Light from a light source (not shown) passes like arrows through a photoconductive plate 92 attached to the back of a dial plate 90 of the measuring instrument, then is reflected by a lower, conical, light introducing part 94 of the central light receiving portion 68 and conducted toward the pointer body 62 positioned above. Above the central light receiving portion 68 are formed cavities 96 and 98 having curved surfaces. Being reflected by these curved surfaces, light rays reach even the fore and rear end portions of the pointer body 62 uniformly, whereby the entirety of the pointer body 62 can be illuminated uniformly. The numeral 100 denotes a pointer support shaft.

Figure 14:
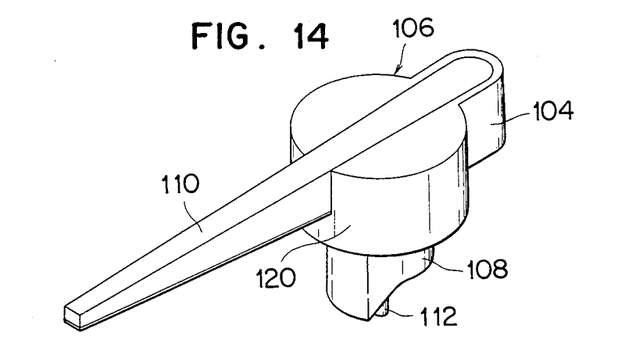
FIG. 14 is a perspective view showing a still further embodiment of the invention.
Figure 15:
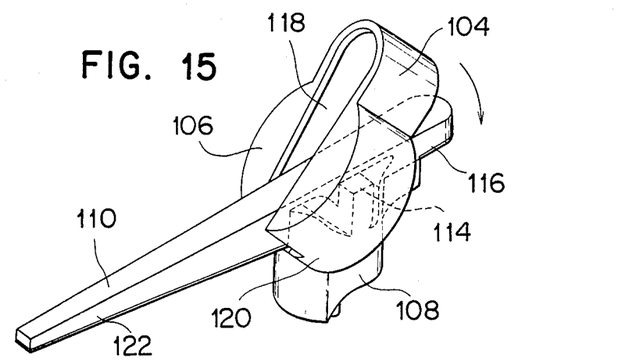
FIG. 15 is an exploded perspective view of FIG. 14.

A further embodiment will be described with reference to FIGS. 14 to 16. FIG. 14 is a perspective view of a pointer for measuring instruments according to this embodiment, and FIG. 15 is an exploded perspective view thereof.

As shown in FIG. 14, the entire upper surface of a pointer body 110 is exposed, and a front lower part of its intermediate portion, both side portions and a rear end portion are covered with an integral cap 106. The numeral 108 denotes a transparent, central light receiving portion for conducting light to the pointer body 110, and the numeral 112 denotes a pointer support shaft.

On both sides of the intermediate portion of the pointer body 110 are formed projections 114, and a stepped portion 116 is formed on the lower surface of the rear end portion thereof.

The integral cap 106 has a central notched portion 118 for exposing the upper surface of the pointer body 110, a front lower strap portion 120 which is in contact with the bottom of the pointer body 110, and a stepped portion 126 of a rear strap portion 104 which stepped portion is adapted to engage the stepped portion 116 of the pointer body 110.

The cap 106 can be mounted and removed in the following manner with respect to the pointer body 110.

Figure 16:
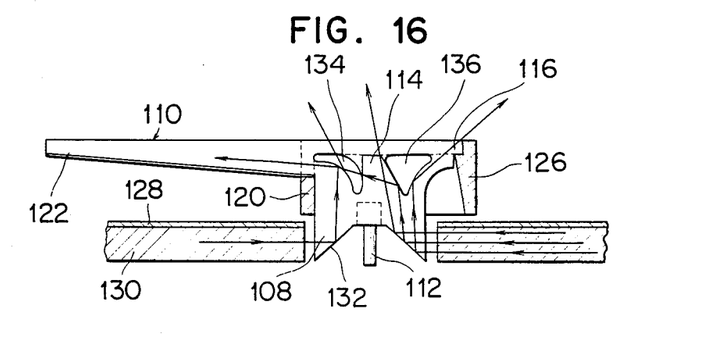
FIG. 16 is a longitudinal sectional view of FIG. 14, showing the operation thereof.

First, as shown in FIG. 16, a fore end portion 122 of the pointer body 110 is inserted from below through the central notched portion 118 of the cap 106. Then, with the front lower strap portion 120 of the cap 106 in contact with the bottom of the pointer body 110 as a fulcrum, the back of the cap 106 is pushed against the projections 114 of the pointer body 110, thereby pushing in the cap 106 to the pointer body 110 side. At this time, the stepped portion 126 at the rear end of the cap 106 undergoes an elastic deformation and is engaged with the stepped portion 116 of the pointer body 110. Thus, the cap 106 is mounted in a predetermined position easily and surely by engagement of its front lower strap portion 120 and rear stepped portion 126 with the pointer body 110.

The cap 106 can be removed by disengaging its rear stepped portion 126 from the pointer body 110 in a direction reverse to the arrow shown in FIG. 16 and pulling out the pointer body 110 from the central notched portion 118 of the cap 106.

In order to make such mounting and removal of the cap easier and more assured, it is preferable that the cap be formed of a highly elastic material such as an opaque resin or a metallic sheet. Being opaque is necessary for the prevention of light leak.

The pointer is illuminated in the following manner. In this connection, reference is made to FIG. 16.

Light from a light source passes like arrows through a photoconductive plate 130 attached to the back of a dial plate 128 of the measuring instrument, then is reflected by a lower, conical, light introducing part 132 of the central light receiving portion 108 and conducted toward the pointer body 110 positioned above. Above the central light receiving portion 108 are formed cavities 132 and 136 having curved surfaces. Being reflected by these curved surfaces, light rays reach even the fore and rear end portions of the pointer body 110 uniformly, whereby the entirety of the pointer body 110 can be uniformly illuminated.

Figure 17:
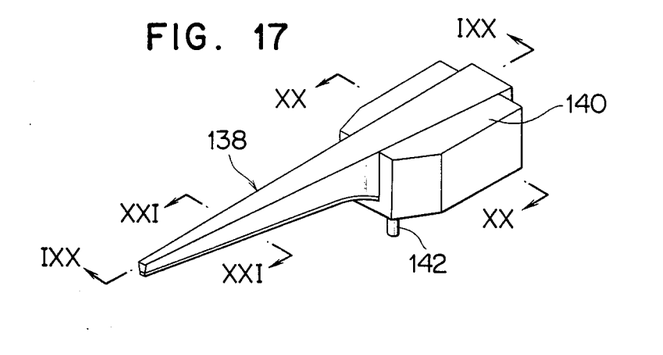
FIG. 17 is a perspective view of a still further embodiment of the invention.

A still further embodiment of the invention will be described with reference to FIGS. 17 to 21. As shown in FIG. 17, the entire surface of a pointer body 138 is exposed, and both side faces of its intermediate and rear end portions are covered with an integral cap 140. The numeral 142 denotes a pointer support shaft.

Figure 18:
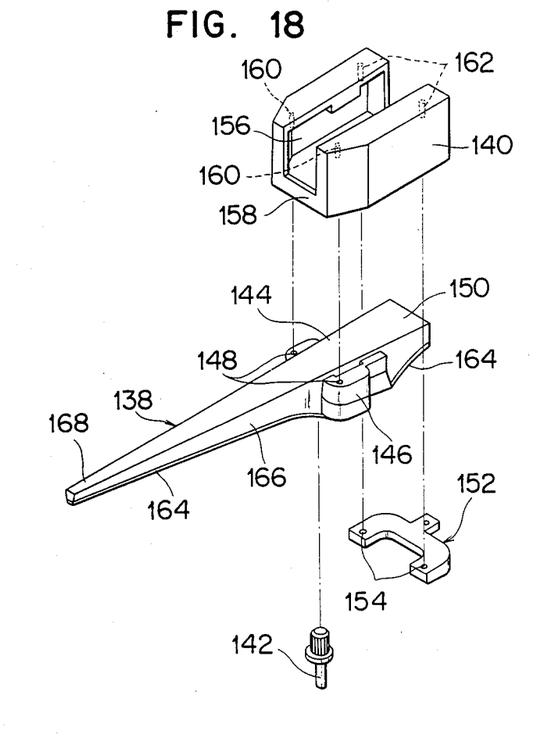
FIG. 18 is an exploded perspective view of FIG. 17.

As shown in FIG. 18, reflective projections 146 are formed on both side faces of an intermediate portion 144 of the pointer body 138, with a positioning hole 148 being formed in the upper surface of each reflective projection 146. Further, to the bottom of a rear end portion 150 of the pointer body 138 is attached a balancer 152 for taking a momental balance in front and in the rear with the support shaft 142 as the center. Also in the upper surface of the balancer 152 are formed positioning holes 154.

On the other hand, the cap 140 has a central opening portion 156 for exposing the upper surface of the pointer body 138 wholly from a fore end portion 168 through the central portion 144 up to the rear end portion 150, a front lower strap portion 158 which is in contact with the bottom of the pointer body 138, bosses 160 provided on the back of the cap for engagement with the positioning holes 148 of the reflective projections 146, and bosses 162 provided on the back of the cap for engagement with the positioning holes 154 of the balancer 152.

The numeral 164 denotes a colored portion which constitutes the bottom of the pointer body 138, and the numeral 166 denotes a colorless transparent portion.

The cap 140 can be mounted to the pointer body 138 by inserting the fore end portion 168 of the pointer body 138 through the central opening portion 156 of the cap 140 and then pushing in the cap 140 with its front lower strap portion 158 as a fulcrum until the bosses 160 and 162 are fitted in the positioning holes 148 and 154.

The cap 140 can be removed in the reverse procedure, that is, by first pulling out the cap 140 to disengage its bosses from the positioning holes 148 and 154 and then pulling out the pointer body 138 from the central opening portion 156 of the cap 140.

In order to make such mounting and removal of the cap 140 easier and more assured, it is preferable that the cap 140 be formed of a highly elastic material such as an opaque resin or a metallic sheet. Being opaque is for preventing the leak of light.

Figure 19:
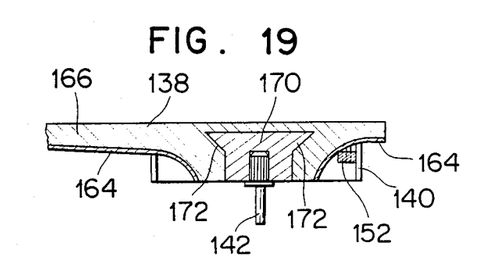
FIGS. 19, 20 and 21 are sectional views taken along lines IXX, XX and XXI of FIG. 17.
Figure 20:
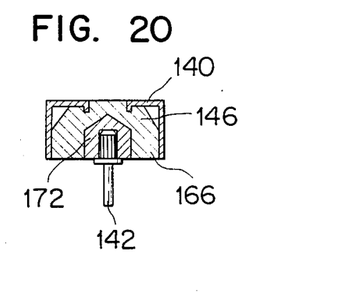
Figure 21:
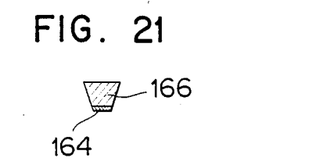

FIGS. 19, 20 and 21 are sectional views taken on lines IXX—IXX, XX—XX and XXI—XXI of FIG. 17, respectively.

In FIGS. 19 and 20, the numeral 170 denotes an opaque colored element fitted into the cavity in the colorless transparent portion 166 formed in the same manner as in the embodiment of FIG. 6, to which is mounted the pointer support shaft 142. The colored portion 170 has slant faces serving as reflective surfaces 172, which reflect and conduct incident light up to the fore and rear end portions 168 and 174 of the pointer.

The pointer is illuminated in the following manner. In this connection, reference is made to FIGS. 22 to 24.

Figure 23:
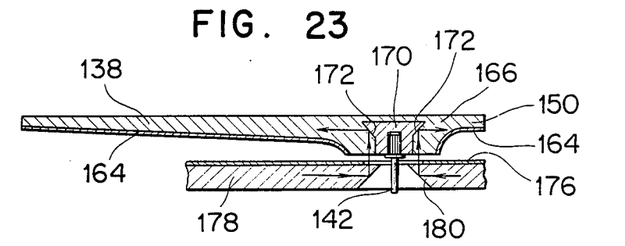

Light from a light source (not shown) passes through a photoconductive plate 178 attached to the back of a dial plate 176 of the measuring instrument then is reflected vertically upward by a conical reflective portion 180 in which is inserted the pointer support shaft 142, and conducted to the transparent portion 166 of the pointer body 138 as indicated with arrows in FIG. 23. Then, the light rays are reflected by the reflective surfaces 172 of the opaque colored portion 170 and reach the fore and rear end portions 168 and 174 of the pointer as shown in the same figure.

Figure 22:
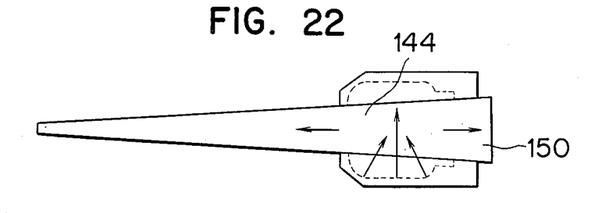
FIGS. 22, 23 and 24 are plan view and sectional views illuminating operation of the embodiment of FIG. 17.
Figure 24:
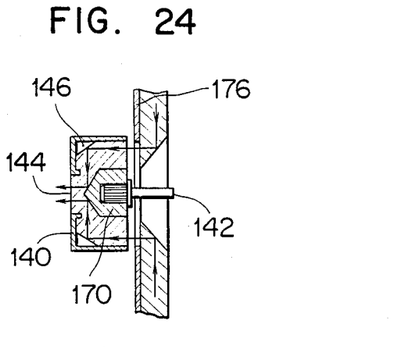

At the same time, as shown in FIGS. 22 and 24, light rays are once reflected by the reflective projections 146, then again reflected by the opaque colored portion 170 and reach the central portion 144, too, of the pointer body 138.

Consequently, the pointer body 138 is illuminated uniformly from its fore end portion 168 through its central portion 144 up to its rear end portion 150, that is, the pointer body 138 can be illuminated as a single continuous line.

Figure 25:
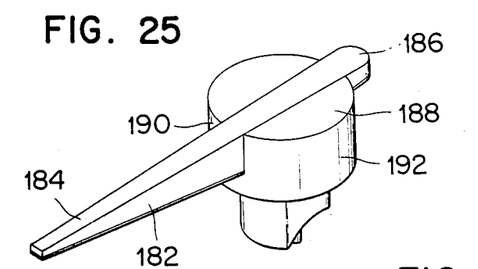
FIG. 25 is a perspective view of a still further embodiment of the invention.

A still further embodiment of the present invention will be described with reference to FIGS. 25, 26 and 27, in which indicated at 182 is a pointer body, at 184 a fore end portion thereof and at 186 a rear end portion thereof. The numeral 188 denotes a cap which is composed of semi-cylindrical bodies 190 and 192 each having a ceiling. The semi-cylindrical bodies 190 and 192 are integrally attached by suitable means such as welding or fitting to the side faces of the pointer body 182 so as to cover a photoconductive portion as will be described hereinafter.

Figure 26:
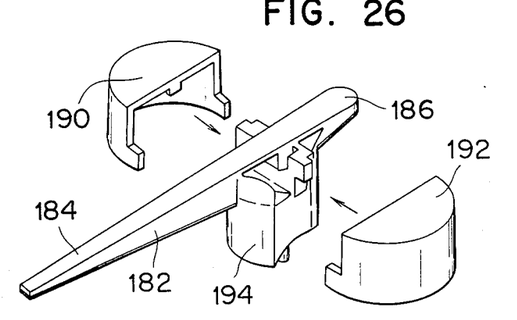
FIG. 26 is an exploded perspective view of FIG. 25.
Figure 27:
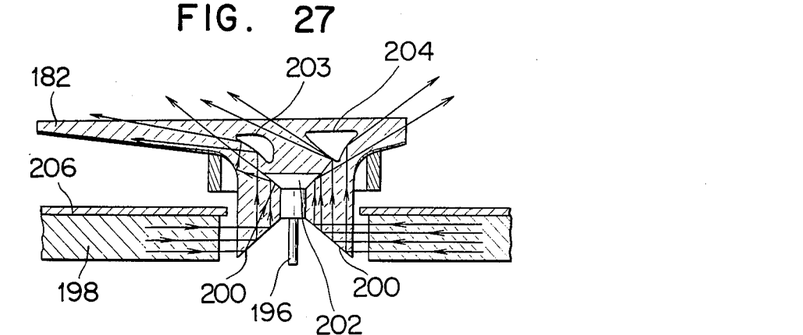
FIG. 27 is a longitudinal sectional view of FIG. 25.

As shown in detail in FIGS. 26 and 27, a photoconductive portion 194 is formed by integral molding with the pointer body 182 so that it is projecting orthogonally to the longitudinal direction of the pointer body 182, with a pointer support shaft 196 being inserted in the lower end of the photoconductive portion 194. The pointer support shaft 196 is connected to a driving shaft of a measuring instrument (not shown) to support the entire of the measuring body 182.

The photoconductive portion 194 has a conical light introducing part 200 for receiving illuminating light from a photoconductive plate 198 and reflecting it upward and an inverted truncated cone-like reflecting part 202 for intercepting and reflecting part of the light reflected by the conical light introducing part 200, the light introducing part 200 and the reflecting part 202 being positioned concentrically with the pointer support shaft 196. The photoconductive portion 194 is further provided, in positions above the inverted truncated cone-like reflecting part 202, with a front reflective cavity part 203 for reflecting the light rays reflected by the above parts toward the front end portion 184 of the pointer body 182 and a rear reflective cavity part 204 for reflecting those light rays toward the rear end portion 186.

In such construction, illuminating light obtained through the photoconductive plate 198 attached to the back of a dial plate 206 is received and refracted upward by the conical light introducing part 200 of the photoconductive portion 194. Part of the thus-reflected light advances upward, while the remaining part is reflected outwardly of the photoconductive portion 194 by the inverted truncated cone-like reflecting part 202, then further reflected by the peripheral surface of the photoconductive portion 194 and becomes an upward illuminating light. The greater part of the illuminating light is reflected toward the fore end portion 184 and rear end portion 186 of the pointer body 182 by the front reflective cavity part 203 and rear reflective cavity part 204. Thus, the reflected light advancing upwardly of the photoconductive portion 194 is reflected in the outer peripheral direction of the latter by the action of the inverted truncated cone-like reflecting part 202. Consequently, a sufficient diffusion can be attained while suppressing convergence of light, that is, the illuminating efficiency can be improved.

The inverted truncated cone-like reflecting part 202 may be changed in its size and the angle of its reflective portion according to the shape of the pointer body 182.

By the aforementioned reflecting actions of the component parts, the pointer body 182 can be illuminated uniformly throughout its overall length.

A still further embodiment of the invention will be described in detail hereinunder with reference to FIGS. 28a to 31.

Figure 28A:
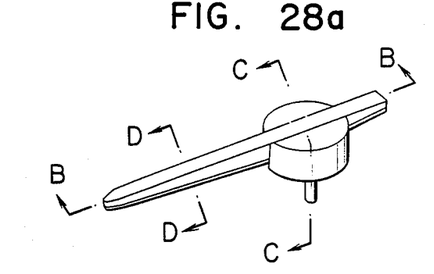
FIG. 28a is a perspective view of a still further embodiment of the invention.
Figures 28B, 28D:
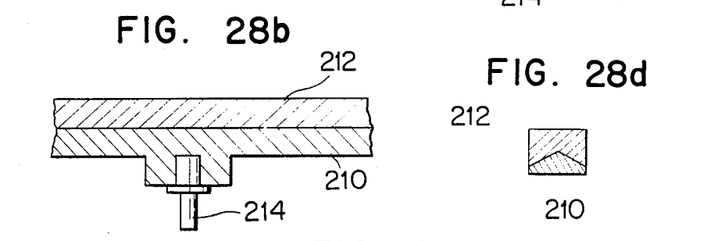
Figure 28C:
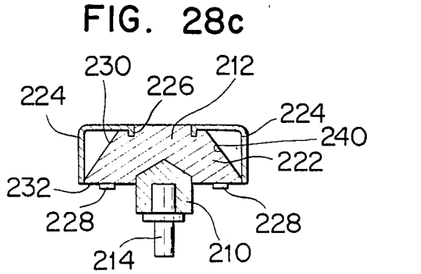
Figures 29, 31, 32, 33, 34A, 34B, 34D:
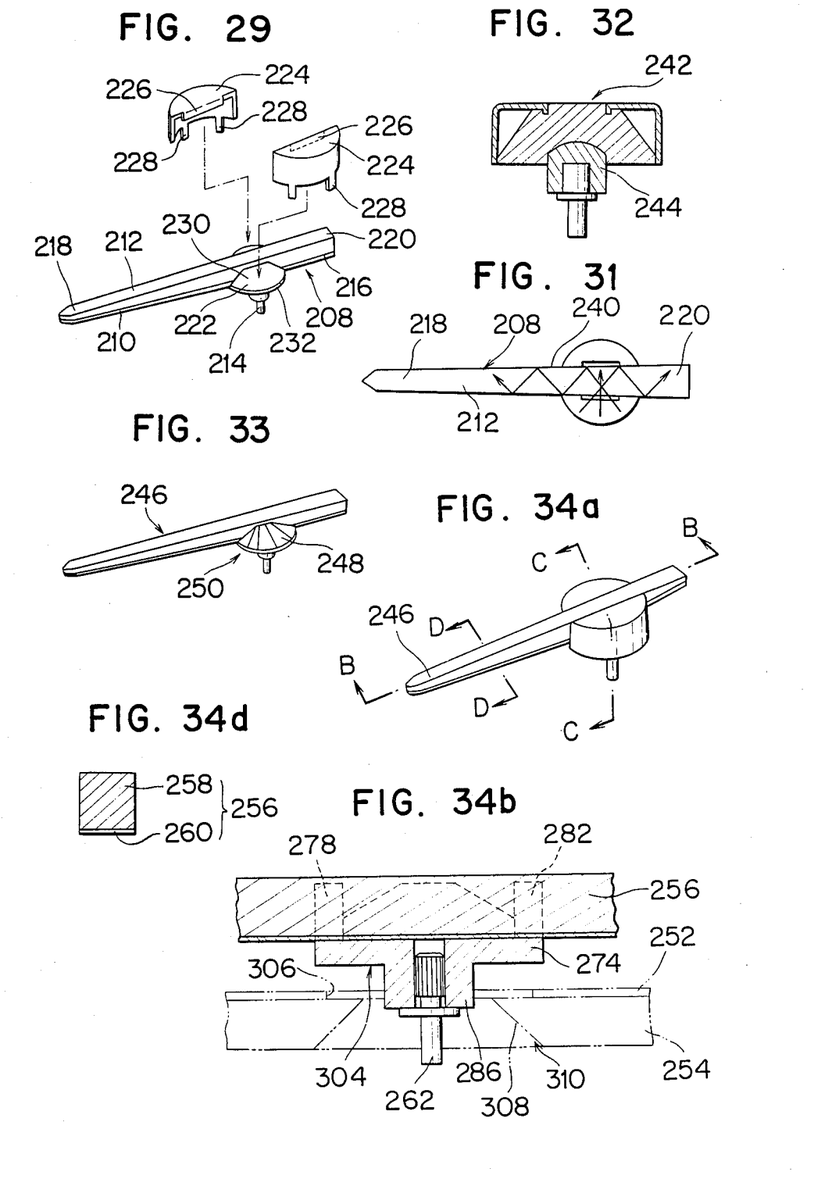
Figure 30:
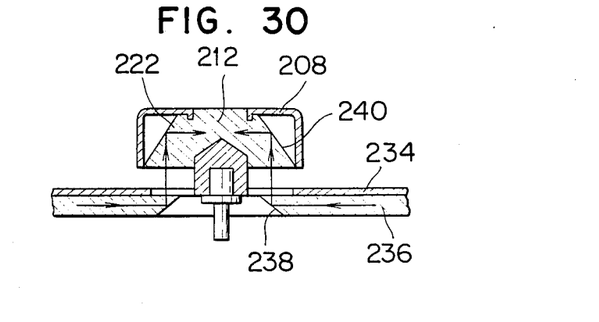

FIG. 28a is a general view of a pointer illuminating structure as assembled according to this embodiment; FIG. 28b is a sectional view taken on line B—B of FIG. 28a, showing a principal portion; FIG. 28c is a sectional view taken on line C—C of FIG. 28a; FIG. 28d is a sectional view taken on line D—D of FIG. 28a; FIG. 29 illustrates the construction of the pointer illuminating device; and FIGS. 30 and 31 illustrate the operation thereof. Referring to those figures, an elongated transparent pointer element 212 has a light inducing section 222 at an intermediate portion thereof in the form of a truncated conical portion. Said truncated conical portion has a conical reflective surface 240. Said transparent pointer element 212 has a substantially flat upper surface. Referring to FIG. 29, a suitably colored portion 210 is applied to the underside of the transparent pointer element 212. Said transparent pointer element 212 is made of a transparent resin and formed by insert molding integrally with a pointer support shaft 214 to be connected to an internal machine (not shown). For coloring, two-color molding is mainly employed.

The colored portion 210 may be differently shaped to take balance (balance of moment around the pointer support shaft 214) of the entirety of the pointer 210.

The transparent portion 212 has a fore end part 218 for pointing to a scale mark on a dial plate (not shown) of the measuring instrument, a rear end part 220 having a design effect. Said truncated conical portions 222 may be separately formed on both sides of a rectilinear portion of the pointer at the central part of the transparent portion 212 for conducting the refraction of light effectively to the fore end part 218 and rear end part 220 of the pointer 208 as will be described later.

Pointer caps 224 are for covering the other portions than the pointer portion to be illuminated, and are formed of a suitably colored resin or formed of a light metal such as an aluminum plate and colored.

The pointer caps 224, for their fixing to the semi-conical reflecting portions 222, are each provided with a positioning guide portion 226 and, if they are formed of a metallic plate, are also provided with lugs 228 in suitable positions.

The positioning guide portions 226 of the pointer caps 224 are fitted in grooves 230 formed in the semiconical reflecting portions 222 of the pointer 208, and the lugs 228 are bent inwards along a bottom of each reflecting portion 222, whereby the paired pointer caps 224 can be attached to the pointer 208.

Operation of the present invention will be described below with reference to FIGS. 30 and 31.

Light (indicated with arrows) from a suitable light source (not shown) passes through a photoconductive plate 236 mounted on the back of a dial plate 234 of the measuring instrument, then is reflected orthogonally in a conical hole 238 in which is inserted the pointer 208, and is introduced into the semi-conical reflecting portion 222 of the pointer 30, where the light is further refracted in an orthogonal direction by a reflective surface 240. Since the semi-conical reflecting portions 222 of the pointer 208 are formed generally circularly, they refract the light from the conical hole 238 of the photoconductive plate 236 in a substantially infinite orthogonal direction, which light reaches the fore or rear end part, 218 or 220, of the pointer 208 while repeating refraction (reflection) between the side faces 240 of the transparent portion 212 as shown in FIG. 31, whereby the transparent portion 212 can be illuminated.

Consequently, the observer (driver) from the transparent portion 212 side can confirm the suitably colored portion 210.

As shown in FIG. 32, the shape of a suitably colored portion 244 of a pointer 242 may be semi-circular, not triangular, and a reflective, surface 248 of a pointer 246 may be semi-pyramidal as indicated at 250 in FIG. 33.

Figure 34C:
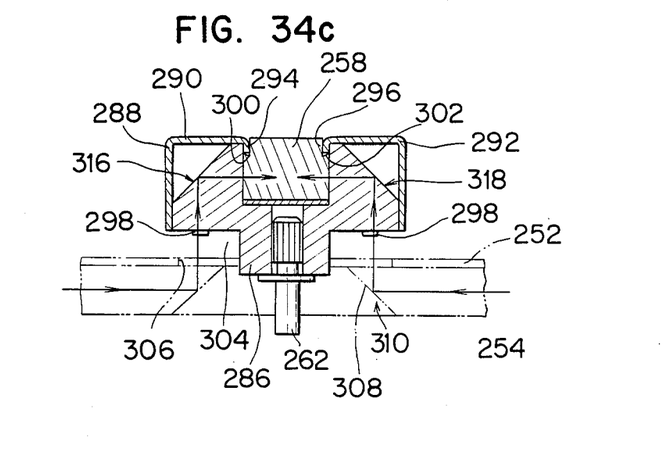
Figure 35:
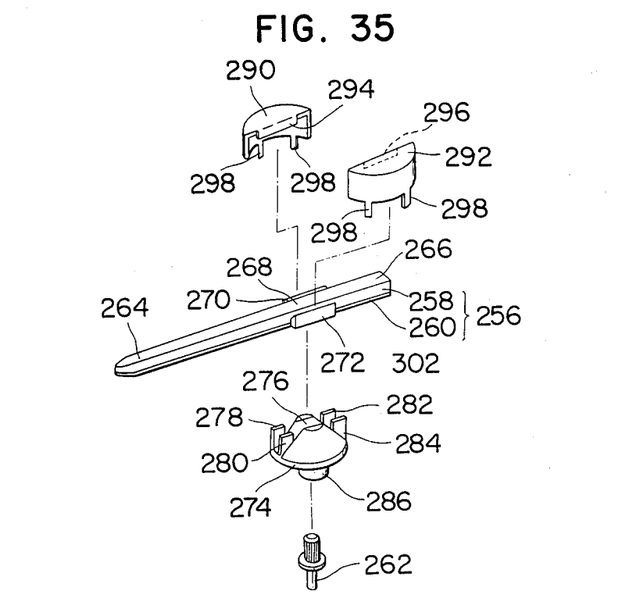
Figure 36:
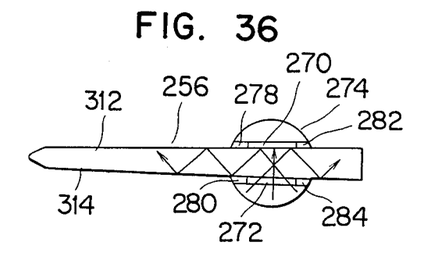
FIG. 36 is a plan view of a pointer and holder portion for explaining the operation of this embodiment.

A still further embodiment of the present invention will be described in detail hereinunder with reference to FIGS. 34a to 35.

A pointer 256 comprises a transparent portion 258 formed of a transparent resin such as an acrylic resin or a polycarbonate resin and a colored portion 260 of any desired color formed on the dial plate 1-side surface of the transparent portion 258. The colored portion 260 has been colored in a suitable color according to, for example, the well-known hot stamping method. Alternatively, an opaque colored resin may be subjected to an insert molding integrally with the transparent portion 258. Particularly, in the case where the colored portion 260 is formed of an opaque resin, a rear end portion 266 of the colored portion 260 may be formed in a special shape to balance the whole of the pointer 256, in other words, so as not to cause a moment in a plane including the pointer 256 and a pointer support shaft 262 with the shaft 262 as the center which shaft is for mounting the pointer to the driving shaft.

The pointer 256 comprises a fore end portion 264 for pointing to a scale mark on the dial plate 252 of the measuring instrument, a rear end portion 266 having a design effect and a light introducing portion 268 positioned between the fore end portion 264 and the rear end portion 266 for introducing light into the pointer 256 and for mounting of a pointer cap. On both sides of the light introducing portion 268 are integrally formed engaging projections 270 and 272 so that the width of the pointer 256 is slightly larger at that portion.

The pointer 256 is held by a holder portion 274. The holder portion 274 is formed of a transparent resin like the one used for the transparent portion 258, and its basic form is generally conical as shown in FIGS. 34c and 35. On its top side is formed a fitting slot 276 extending in a direction orthogonal to the axis of the holder portion 274, and if necessary, stopper pieces 278, 280, 282 and 284 are integrally formed on the opposed faces of both end portions of the fitting slot 276. The light introducing portion 268 of the pointer 256 is fitted in the slot 276, that is, the projecting faces of the engaging projections 270 and 272 are substantially opposedly contacted with the side faces of the fitting slot 276. Further, as shown in FIG. 34B, the engaging projections 270 and 272 are held respectively between the stopper pieces 278 and 282 and between the stopper pieces 280 and 284 whereby the longitudinal movement of the pointer 256 is restricted relative to the holder portion 274. The end faces of the stopper pieces 278, 280, 282 and 284 are positioned flush with the cone top of the holder portion 274. On the cone bottom side of the holder portion 274 is integrally extended a cylindrical connection 286 which is coaxial with the holder portion. Into the connection 286 is press-fitted and connected one end portion of the pointer support shaft 262.

The holder portion 274 adjacent to both side portions of the pointer 256 is covered with a pointer cap 288. The pointer cap 288, which covers other than the portion of the pointer 256 to be illuminated, is formed of a suitable colored resin or formed of a light metal such as an aluminum plate and colored. As a whole, it is generally in the form of a short cylinder having one closed end, and comprises centrally divided cap halves 290 and 292.

The cap halves 290 and 292 are integrally formed with positioning guide pieces 294 and 296 respectively inwardly along the split lines of their closure plates, while lugs 298 are integrally formed in suitable positions at the respective open edge portions. After the pointer 256 is press-fitted and fixed in the fitting slot 276 of the holder portion 274, the cap halves 290 and 292 are disposed on both sides of the light introducing portion 268 of the pointer 256, and the respective guide pieces 294 and 296 are engaged respectively with stepped portions 300 and 302 of the engaging projections 270 and 272 formed on the side opposite to the pointer support shaft 262, and the lugs 298 are bent inside along the bottom 304 of the holder portion 274, whereby the paired cap halves 290 and 292 are fitted over the holder portion 274. To ensure the mounting of the cap halves 290 and 292, it is preferable that the stepped portions 300 and 302 be inclined toward the colored portion 260 of the pointer 256. The cap 288 when attached to the pointer 256 is in the form of a cylinder whose diameter is larger than that of a driving shaft insertion hole 306 formed in the dial plate 252.

Figure 9:
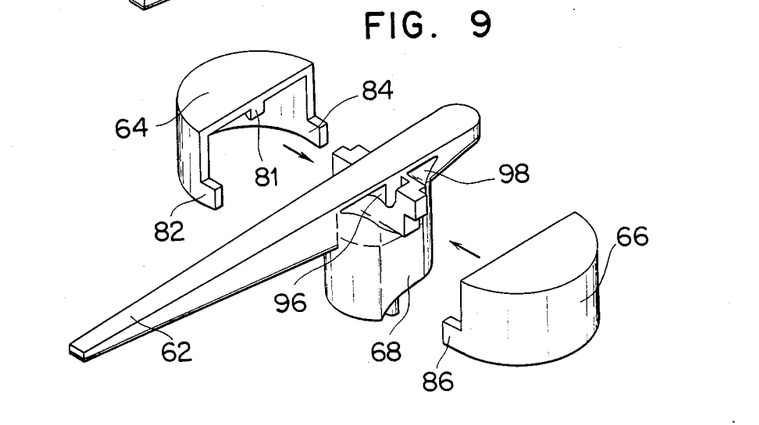
FIG. 9 is an exploded view of the embodiment of FIG. 8.

Operation of the present invention will now be described. Light (indicated with arrows) from a suitable light source (not shown) passes through the photoconductive plate 254 mounted on the back of the dial plate 252 and reaches a driving shaft insertion hole 308 formed in the photoconductive plate 254. The inner peripheral surface of the insertion hole 308 is a conical slant face 310, whereby the light incident upon the photoconductive plate 254 is reflected perpendicularly upward and introduced through the bottom 304 into the holder portion 274, where the light is refracted orthogonally inward by a conical peripheral surface 316 of the holder portion 274. Since the holder portion 274 is formed generally conical, the light from the slant face 310 of the photoconductive plate 254 is refracted in a substantially infinite orthogonal direction as shown in FIG. 9 and reaches the fore or rear end portion 264 or 266 of the pointer 256 while repeating refraction (reflection) between side faces 312 and 314 of the transparent portion 258 of the pointer 256 as shown in the same figure, whereby the pointer 256 is illuminated throughout its overall length. Consequently, the observer (driver) from the transparent portion 258 side can confirm the suitably colored portion 260.

According to this embodiment, as set forth hereinabove, while the illuminating lamp is not turned on, for example, during the daytime, the colored portion 260 can be seen directly because the surface side (observer side) of the pointer is transparent, and so there can be provided a deep pointer. When the pointer 256 is illuminated, for example, during the night, light which has been refracted by the holder portion 274 can be introduced throughout the transparent portion 258 of the pointer 256, whereby the entirety of the pointer can be illuminated in just the same contents as that capable of being confirmed during the daytime with the colored portion 260 as a single line extending from the fore end portion 264 up to the rear end portion 266 of the pointer 256. Therefore, it is possible to provide a novel points illuminating device having an improved pointer visuality in a measuring instrument or the like.

Figure 37:
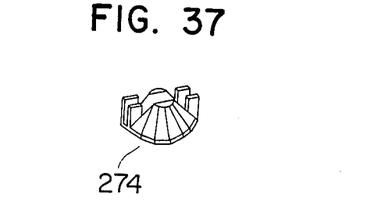
FIG. 37 is a perspective view showing another modification of the holder portion.
Figure 38:
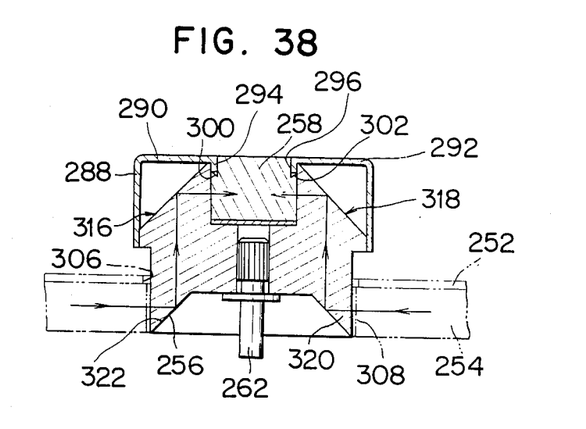
FIG. 38 is a sectional view similar to FIG. 34 showing another modification thereof.

It goes without saying that the present invention is not limited to the foregoing one embodiment and that modifications may be made within a scope not departing from the gist of the present invention. For example, the holder portion 274 may be in the form of a pyramid as shown in FIG. 37, or there may be adopted such a structure as shown in FIG. 38, in which the peripheral surface of the shaft insertion hole 308 of the holder portion 274 is cylindrical and a part of the holder portion 274 is inserted as an extension into the hole 308, with a reflection surface 322 being formed in the extension 320.

According to the present invention as set forth hereinabove, the following effects can be obtained.

(1) Since the central reflecting portion is formed as a hollow curved reflective surface which is open sideways of the pointer and the transmissive colored portion is formed throughout the upper surface of the pointer, the reflective surfaces in the interior of the pointer and the pointer support shaft can be covered, and for illumination at night, the entirety of the pointer upper surface can be illuminated as a single line with transmitted light.

(2) For illumination at night, the unique reflective surfaces permit light introduced from below to diffuse forward and rearward throughout the overall length of the pointer, whereby the pointer can be illuminated uniformly.

As a synergistic effect of the above (1) and (2), there can be attained improvement of visuality and design-related restrictions are eliminated, and thus the present invention can fully meet the market demand.

What is claimed is:

1. A pointer illuminating structure in a measuring instrument comprising:

a transparent pointer element of generally elongated structure having a continuous flat upper surface over the entire length thereof; a pivot point intermediate opposite longitudinal ends of and below said upper surface; and first flank sides substantially perpendicular to said flat upper surface at said pivot point;

light inducing and deflecting means substantially at said pivot point and below said continuous flat upper surface for inducing light beams from below and deflecting the thus induced light beams into the transparent pointer element; said light inducing and reflecting means having second flank sides;

elongated reflective means in the transparent pointer element at a lower surface in facing relation to said continuous flat upper surface, on opposite sides of said light inducing and reflecting means; and light shield means provided on both lateral sides of said transparent pointer element and covering said first and second flank sides, for shielding any leakage light beams from the light inducing and deflecting means while leaving said continuous flat upper surface completely exposed.

2. A pointer illuminating structure in a measuring instrument comprising:

a transparent pointer element of generally elongated structure having a continuous flat upper surface over the entire length thereof; a pivot point intermediate opposite longitudinal ends of and below said upper surface; and first flank sides substantially perpendicular to said flat upper surface at said pivot point;

light inducing and deflecting means substantially at said pivot point and below said continuous flat upper surface for inducing light beams from below and deflecting the thus induced light beams into the transparent pointer element; said light inducing and reflecting means having second flank sides;

elongated reflective means in the transparent pointer element at a lower surface in facing relation to said continuous flat upper surface, on opposite sides of said light inducing and reflecting means; and light shield means provided on both lateral sides of said transparent pointer element and including a pair of cap halves snap-fitted to said first and second flank sides and covering the same, for shielding any leakage light beams from the light inducing and deflecting means while leaving said continuous flat upper surface completely exposed.

* * * * *